United States Patent [19]
Nakamura

[11] Patent Number: 5,398,202
[45] Date of Patent: Mar. 14, 1995

[54] REPROGRAMMABLE NONVOLATILE SEMICONDUCTOR MEMORY FORMED OF MOS TRANSISTORS AND REPROGRAMMING METHOD THEREOF

[75] Inventor: Norio Nakamura, Tokyo, Japan
[73] Assignee: NEC Corporation, Tokyo, Japan
[21] Appl. No.: 62,397
[22] Filed: May 17, 1993
[51] Int. Cl.$^6$ .............................................. G11C 16/04
[52] U.S. Cl. ................ 365/185; 365/189.01; 365/218
[58] Field of Search ............... 365/185, 218, 189.01

[56] References Cited

U.S. PATENT DOCUMENTS

| | | | |
|---|---|---|---|
| 5,016,215 | 5/1991 | Tigelaar | 365/185 |
| 5,191,556 | 3/1993 | Radjy | 365/185 |
| 5,199,001 | 3/1993 | Tzeng | 365/218 |

*Primary Examiner*—Viet Q. Nguyen
*Assistant Examiner*—F. Niranjan
*Attorney, Agent, or Firm*—Popham, Haik, Schnobrich & Kaufman Ltd.

[57] ABSTRACT

A reprogramming method of a nonvolatile semiconductor memory formed of MOS transistor cells is provided. Data values are written to transistors of one of groups which is obtained by dividing the entire MOS transistors, and one of the transistors whose data values are written is selected. Then, the data value written in the selected transistor is erased. The selection and erasing are repeated until the data values written in the desired transistors are erased. Thus, reprogramming of the memory is finished. Since the threshold voltage of the transistor erased is well controlled, the threshold voltage dispersion after reprogramming can be reduced.

15 Claims, 4 Drawing Sheets

REPROGRAMMABLE NONVOLATILE SEMICONDUCTOR MEMORY FORMED OF MOS TRANSISTORS AND REPROGRAMMING METHOD THEREOF

BACKGROUND OF THE INVENTION

1. Field of the Invention

The present invention relates to a reprogrammable nonvolatile semiconductor memory formed of Metal Oxide Semiconductor (MOS) transistors and a reprogramming method thereof.

2. Description of the Related Art

With a conventional reprogrammable nonvolatile semiconductor memory formed of MOS transistors, or an Erasable Programmable Read Only Memory (EPROM), there is provided with a semiconductor substrate whose impurity concentration in the surface area is higher than that of an MOS transistor used for a general purpose so as not to reduce the programming speed or so as to improve the programming efficiency. Thus, the threshold voltage, which is applied to a control gate formed on a floating gate through a insulator film of the MOS transistor, of the EPROM is in the range from 1.5 V to 3.0 V and higher than that of the MOS transistor.

When the conventional EPROM is driven by a generally-used supply voltage of 5 V, there arises no problem. However, when it is driven by a lower supply voltage such as 1.5 V, there arises a problem that the data values stored in the storage cells cannot be read since electric currents do not flow in all the MOS transistors constituting the cells, even if the supply voltage of 1.5 V is directly applied to the control gate.

A conventional EPROM developed to solve the problem is shown in FIG. 1, in which each storage cell is composed of two MOS transistors. Each of the cell includes an MOS transistor 22 for writing whose threshold voltage is higher than the supply voltage 1.5 V and an MOS transistor 21 for reading whose threshold voltage is lower than 1.5 V. The floating gates of the transistors 21 and 22 are composed of a polysilicon film 11a and the control gates thereof are composed of an N-diffusion layer 13a formed on the film 11a through an insulation film. Metal wirings 20a, 20b and 20c are formed on the layer 13a through an insulation film.

The transistors 21 is formed between the wirings 20a and 20b and the transistors 22 is formed between the wirings 20b and 20c.

When data values are written into the storage cells in FIG. 1, a higher voltage than the threshold voltage is supplied between the source region and the control gate of the transistor 22 to form a channel in the semiconductor substrate of the EPROM. When the stored data values are read from the storage cells in FIG. 1, a higher voltage than the threshold voltage is supplied between the source region and the control gate of the transistor 21 to form a channel in the semiconductor substrate. Since the threshold voltage of the transistor 21 is lower than 1.5 V, the stored data value can be read even if the supply voltage is 1.5 V.

Recently, an EPROM shown in FIGS. 2 and 3 has been developed, in which programmed data values are erased simultaneously. With the EPROM, the threshold voltage of each storage cell can be controlled electrically, so that such MOS transistors for writing and reading as described above are not required and each storage cell can be composed of one transistor. The EPROM shown in FIGS. 2 and 3 has a so-called "Diffusion Self Aligned (DSA) structure" (See Kikuchi et al., "DSA-type Non-Volatile memory transistor with self-aligned gate", Jpn. J. Appl. Phys., Vol. 17, 1977, PP49-54).

In FIG. 2 showing a partial section of the EPROM, there are shown only two of many storage cells arranged in a matrix array on the semiconductor substrate, and in FIG. 3, there are shown only four storage cells thereof.

In FIG. 2, in a surface area of a P-silicon substrate 28, an N-diffusion layer 24a as a common drain region is formed, and N-diffusion layers 24b and 25 as a drain region is formed on each side of the diffusion layer 24a. The respective diffusion layers 25 are formed in the vicinity of the respective diffusion layers 24b so as to surround the respective layers 24b.

A P-diffusion layer 26 is formed in the vicinity of the N-drain region 24a so as to surround the region 24a. The N-drain region 24a and P-diffusion region 26 constitute the DSA structure. Impurity concentration of the surface area of the substrate 28 is made higher than the case of not providing the P-diffusion region 26 due to the region 26, so that a high electric field is formed along the channel when a voltage is supplied between the source region 24a and drain region 24b. As a result, the injection efficiency of the hot electrons to a floating gate can be improved and data values can be written to the cells by a lower drain voltage.

On the surface of the substrate 28, two tunnel oxide films 12 are formed between the respective source regions 24b and the drain region 24a, respectively. A floating gate 11 is formed on each of the films 12. Each of the floating gates 11 is insulated from its surroundings by an oxide film 13 and a control gate 14 is formed on the oxide film 13.

Due to the "tunnel phenomenon", the hot electrons generated in the channel are injected through the oxide films 12 to the floating gates 11 and stored therein, and the stored electrons in the gates 11 are removed through the oxide films 12 to the drain region 24a.

An interlayer insulator film 19 covers the surfaces of the control gates 14 and the oxide films 13 and the exposed surface of the substrate 28. A metal wiring layer 20 is formed on the insulator film 19 except a contact hole thereof. The wiring layer 20 is in contact with the surface of the drain region 24a through the contact hole to electrically connected to the region 24a.

The common drain region 24a, the source region 24b, the diffusion region 25, the floating gate 11 and the control gate 14 on the left side in FIG. 2 constitute an MOS transistor Tr11 shown in FIG. 3. The common drain region 24a, the source region 24b, the diffusion region 25, the floating gate 11 and the control gate 14 on the right side in FIG. 2 constitute an MOS transistor Tr13 in FIG. 3. The wiring layer 20 corresponds to a digit line D11 in FIG. 3. The source region 24b on the left side is connected to a source line S11 in FIG. 3 and the source region 24b on the right side is connected to a source line S12 in FIG. 3.

In FIG. 3, the digit line D11 and a digit line D12 are arranged perpendicular to word lines W11 and W12 and the source lines S11 and S12. The word lines W11 and W12 are parallel to the source lines S11 and S12.

The word line W11 is connected to the control gates of the N-channel MOS transistors Tr11 and Tr12, and the word line W12 is connected to the control gates of the N-channel MOS transistors Tr13 and Tr14. The digit line D11 is connected to the drain regions of the transistors Tr11 and Tr13, and the digit line D12 is connected to the drain regions of the transistors Tr12 and Tr14.

The source line S11 is connected to the source region of the transistors Tr11 and Tr12, and the source line S12 is connected to the source regions of the transistors Tr13 and Tr14. The source lines S11 and S12 are connected to each other.

Other N-channel MOS transistors, word lines, digit lines and source lines, which are not shown in FIG. 3, are arranged and connected similarly.

Next, the data erasing and writing operations of the conventional EPROM shown in FIGS. 2 and 3 will be described below.

When the stored data value in the EPROM are erased, a positive voltage is applied to the source regions of all the transistors including the transistors Tr11, Tr12, Tr13 and Tr14 through all the source lines including the source lines S11 and S12. In each of the transistors, the Fowler-Nordheim current flows between the floating gate and the source region; thus, the electrons stored in the floating gate are drawn out. As a result, the programmed data values stored in all the storage cells are erased simultaneously.

When the data values are stored or the EPROM is reprogrammed, a positive voltage higher than the threshold voltage is applied to the word line connected to the cell or bit to be written, or the control gate thereof, with the source regions of all the transistors through all the source lines being grounded. In the transistors of the cell to be written, an electric current flows along the channel and at the same time, the hot electrons are generated in the channel near the drain region; thus, the hot electrons are injected and stored in the floating gate. As a result, the selected cell is reprogrammed.

With the conventional EPROM in FIGS. 2 and 3, since the impurity concentration in the surface area of the substrate 28 is high, a high electric field can be generated in the surface area along the channel. As a result, there is an advantage that the injection efficiency of the hot electrons can be improved to reprogram the EPROM by a lower drain voltage.

However, the EPROMs described above have the following problems.

With the EPROM shown in FIG. 1, since two transistors are used in one cell or bit, the cell area becomes large, and an additional process such as an ion-implantation is required to reduce the threshold voltage of the transistor for reading in the fabrication process thereof.

With the EPROM shown in FIGS. 2 and 3, dispersion of the threshold voltage of the transistors is generated after the data values are erased.

For example, in case that the data values stored in the transistors Tr11, Tr12, Tr13 and Tr14 shown in FIG. 3 are erased, since the source regions of the transistors Tr11, Tr12, Tr13 and Tr14 are connected each other through the source lines S11 and S12, if the desired threshold voltage reduction of the transistor Tr11 is obtained earlier than those of the transistors Tr12, Tr13 and Tr14 due to a voltage applied to the source lines S11 and S12, the erasing operation has to be stopped even if the threshold voltage reductions thus obtained of the transistors Tr12, Tr13 and Tr14 are not enough for data erasing, It is the reason that if the erasing operation is continued until the data values stored in all the transistors Tr11, Tr12, Tr13 and Tr14 are erased, the threshold voltage of the transistor Tr11 whose data values are already erased is overreduced and the transistor Tr11 becomes to have a function of a depletion-type one and as a result, a desired potential cannot be applied to the source regions of the transistors Tr12, Tr13 and Tr14 since an electric current flows through the transistor Tr11 even if a potential is applied to the source lines.

On the other hand, if the erasing operation is stopped when the data values stored in the transistor Tr11 are erased, the threshold voltages of the transistors Tr12, Tr13 and Tr14 become higher than that of the transistor Tr11.

There has not been developed any technique which can erase the data values stored in all the storage cells simultaneously without the threshold voltage dispersion and can put it to a practice use in EPROMs such as one in FIGS. 2 and 3.

It is possible to erase the stored data value per cell instead of erasing the data values in all the cells simultaneously. However, wirings are required to be formed so as to connect the respective cells, or the respective sources of the transistors, separately, and as a result, the cell area increases sharply.

SUMMARY OF THE INVENTION

Accordingly, it is an object of the present invention to provide a reprogrammable nonvolatile semiconductor memory formed of MOS transistors, in which the threshold voltage dispersion of the transistors after reprogramming the data values stored can be reduced with such a small cell area as that of the conventional one whose storage cell is composed of one transistor.

Another object of the present invention is to provide a reprogramming method of a reprogrammable nonvolatile semiconductor memory formed of MOS transistors, in which the threshold voltage dispersion of the transistors after reprogramming the data values stored can be reduced.

In a first aspect of the present invention, a reprogrammable nonvolatile semiconductor memory is provided, which has storage cells each of which is formed of an MOS transistor and arranged in a matrix array on a semiconductor substrate of a first electroconductive type.

Each of the transistors comprises a source and drain regions both of which are of a second electroconductive type inverse in polarity to the first electroconductive type, a floating gate formed through a first gate insulator film on the surface of the substrate, and a control gate formed through a second gate insulator film on the floating gate.

The substrate has word lines respectively connected to the control gates of the transistors belonging to each row of the matrix, digit lines respectively connected to the drain regions of the transistors belonging to each column of the matrix, source lines respectively connected to the source regions of one of the groups which is obtained by dividing the entire transistors.

A reprogramming data value is written to the desired cell by applying a voltage through the corresponding source line.

In a preferred embodiment, the P-N junction between the drain region of the second electroconductive type and the substrate of the first electroconductive type is a graded-junction. And the source region of the second electroconductive type has a DSA structure composed of a first region of the first electroconductive type and a second region of the second electroconductive type.

In a second aspect of the present invention, a reprogramming method of a reprogrammable nonvolatile semiconductor memory formed of MOS transistors is provided.

The method comprises the steps of writing data values to the transistors of one of the groups which is obtained by dividing the entire transistors, selecting one of the transistors whose data values are written, and erasing the data value written in the selected transistor.

With the memory and reprogramming method of the invention, data values are written to the entirety or part of the storage cells and then, the cell whose data value is to be erased is selected and the data value thereof is erased. Thus, the threshold voltage of the transistor can be controlled well per cell after the data value is erased, so that the threshold voltage dispersion can be reduced.

As a result, the data values can be surely read out by applying a lower supply voltage such as 1.5 V if the threshold voltages are set about 1 V.

In addition, each storage cell of the memory of the invention is composed of one transistor and no wiring is required to be formed so as to connect the respective cells separately, so that the cell area does not increase compared to the conventional memory whose storage cell is composed of one transistor.

DETAILED DESCRIPTION OF THE PREFERRED EMBODIMENT

Next, a preferred embodiment of the present invention will be described below referring to FIGS. 4 to 6 attached.

Figure 1:
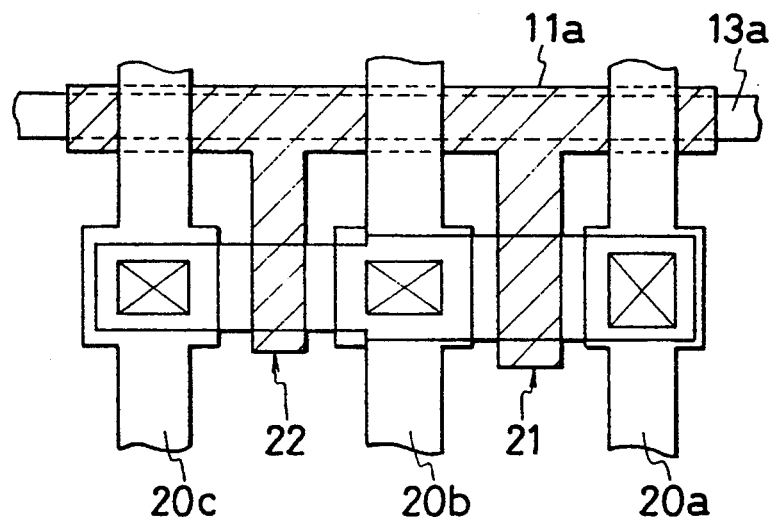
FIG. 1 shows a layout of storage cells of a conventional EPROM.
Figure 2:
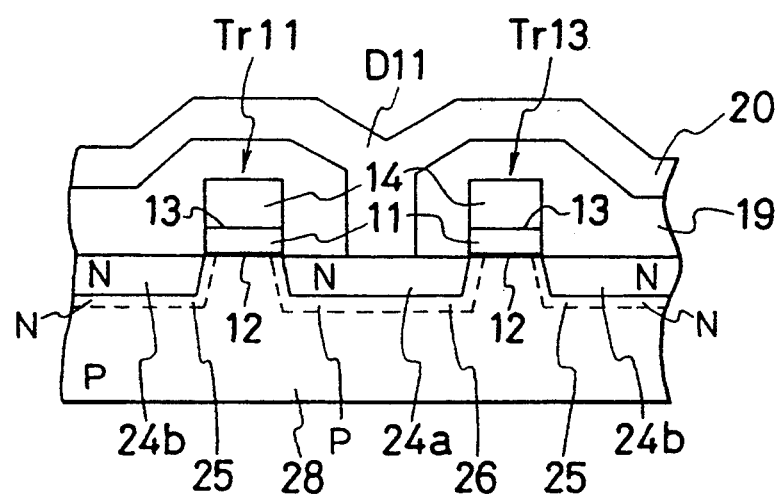
FIG. 2 is a partial sectional view of a conventional EPROM whose storage cells are composed of two transistors respectively.
Figure 3:
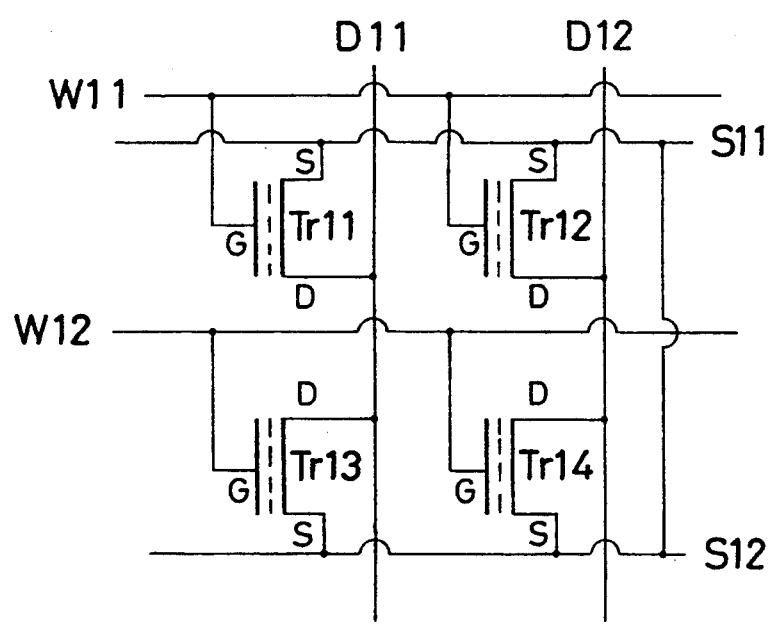
FIG. 3 is an equivalent circuit diagram of the conventional EPROM shown in FIG. 2.
Figure 4:
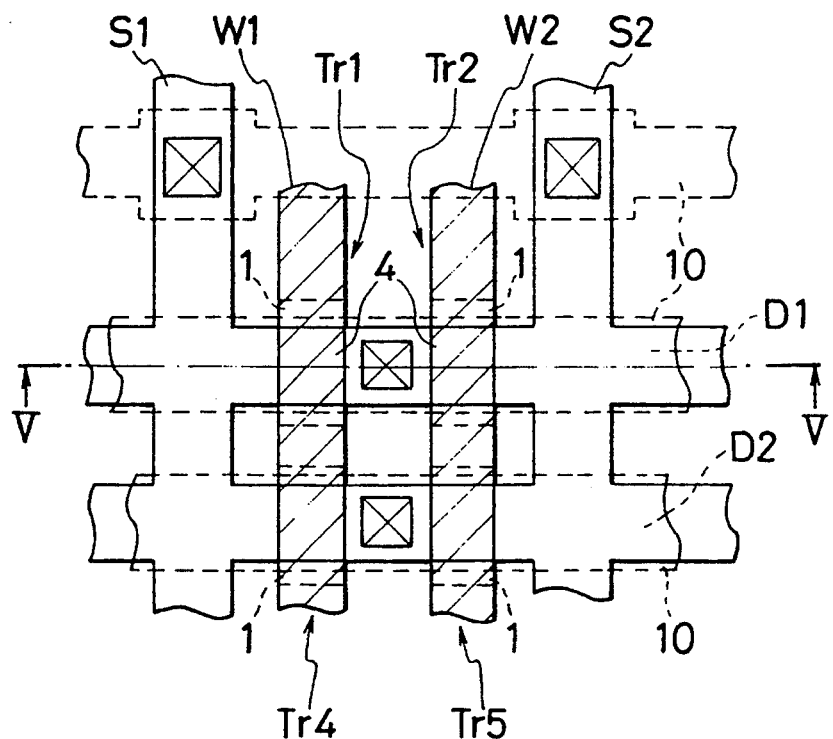
FIG. 4 shows a layout of storage cells of a reprogrammable nonvolatile semiconductor memory formed of MOS transistors according to an embodiment of the present invention.
Figure 5:
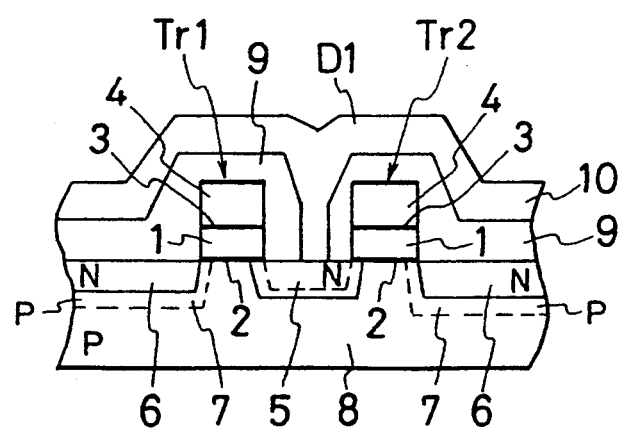
FIG. 5 is a partially cross-sectional view of the storage cell taken on line V—V of FIG. 4.

A reprogrammable nonvolatile semiconductor memory formed of MOS transistors according to an embodiment of the present invention has a structure shown in FIGS. 4 and 5. Each of the storage cells of the memory is composed of one N-channel MOS transistor. A plurality of the storage cells are arranged in a matrix array on a silicon substrate, however, only two cells thereof are drawn in FIGS. 4 and 5 and only six cells thereof are drawn in FIG. 6.

In FIG. 5, in a surface area of a P-silicon substrate 8, an N-diffusion layer 5 as a common drain region is formed, and an N-diffusion layer 6 as a source region are formed on each side of the diffusion layer 5. The respective diffusion layers 7 are formed in the vicinity of the respective diffusion layers 6 so as to surround the respective layers 6.

The respective N-source regions 6 and respective P-diffusion regions 7 constitute the DSA structure. Impurity concentration of the surface area of the substrate 8 is made higher than the case of not providing the P-diffusion region 7 due to the P-diffusion region 7, so that a high electric field is formed along the channel when a voltage is supplied between the source region 6 and the drain region 5. As a result, the injection efficiency of the hot electrons to a floating gate can be improved and data values can be written to the cells by a lower drain voltage.

On the surface of the substrate 8, tunnel oxide films 2 made of silicon dioxide whose thicknesses are both in the range from 90 to 130 Å are formed between the respective source region 6 and the drain region 5, respectively. A floating gate 1 made of polysilicon is formed on each of the films 2. Each of the floating gates 1 is insulated from its surroundings by an oxide film 3 made of silicon dioxide and a control gate 4 made of polysilicon is formed on the film 3.

Due to the "tunnel phenomenon", the hot electrons generated in the channel are injected through the oxide films 2 to the floating gates 1 and stored therein, and the stored electrons in the gates 1 are removed through the oxide films 2 to the drain region 5.

An interlayer insulator film 9 covers the surfaces of the control gates 4 and the oxide films 3 and the exposed surface of the substrate 8. A metal wiring layer 10 is formed on the insulator film 9 except a contact hole thereof. The wiring layer 10 is in contact with the surface of the drain region 5 through the contact hole to electrically connected to the region 5.

Figure 7:
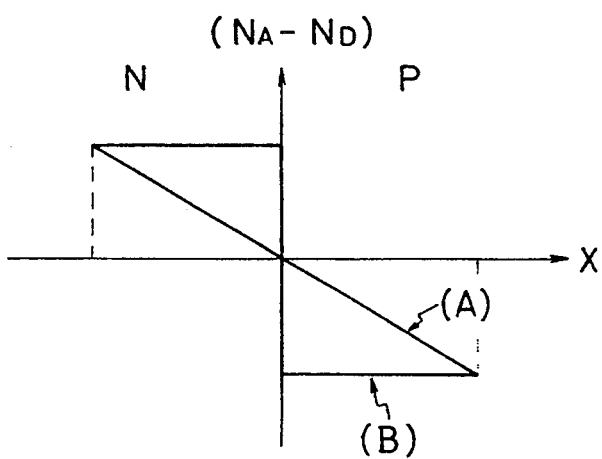
FIG. 7 shows impurity concentration changes of the P-N junction and its vicinity.

The N-drain region 5 is formed by a generally used diffusion technique, so that the P-N junction between the N-drain region 5 and the P-substrate 8 is a graded-junction shown by a line (A) in FIG. 7. That is, the impurity concentration changes gradually in the vicinity of the P-N junction. In FIG. 5, the transition region of the P-N junction is shown by a solid line and a broken line. The withstand voltage of the P-N junction is preferably higher than the reverse voltage applied on erasing the data value. In FIG. 7, NA and ND indicate concentrations of a P- and N-impurities, respectively.

The N-source region 6 and the adjacent P-diffusion layer 7 constitute the DSA structure, so that the P-N junction between the N-source region 6 and the P-diffusion layer 7 is a step-junction shown by a bent line (B) in FIG. 7. That is, the impurity concentration changes sharply in the vicinity of the P-N junction. In FIG. 5, the transition region of the P-N junction is shown by a solid line between the source region 6 and the diffusion layer 7.

Figure 6:
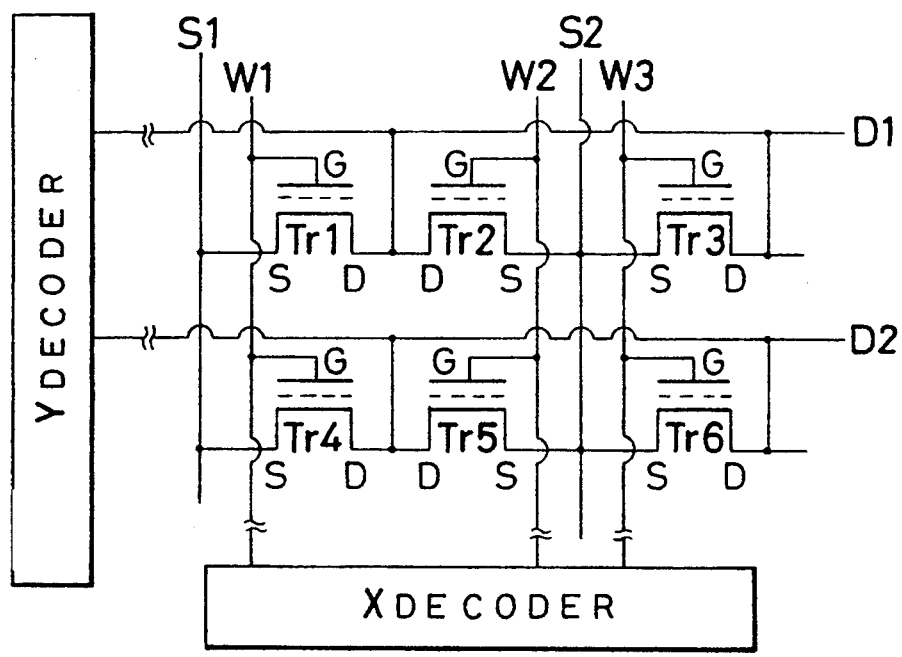
FIG. 6 is an equivalent circuit diagram of the memory shown in FIG. 4.

The common drain region 5, the source region 6, the floating gate 1 and the control gate 4 on the left side in FIG. 5 constitute an MOS transistor Tr1 shown in FIG. 6. The common drain region 5, the source region 6, the floating gate 1 and the control gate 4 on the right side in FIG. 5 constitute an MOS transistor Tr2 in FIG. 6. The wiring layer 10 corresponds to a digit line D1 in FIG. 6. The source region 6 on the left side is connected to a source line S1 in FIG. 6 and the source region 6 on the right side is connected to a source line S2 in FIG. 6.

In FIG. 6, the digit line D1 and a digit line D2 are arranged perpendicular to word lines W1, W2 and W3 and the source lines S1 and S2. The word lines W1, W2 and W3 are parallel to the source lines S1 and S2.

The word line W1 is connected to the control gates of the N-channel MOS transistors Tr1 and Tr4 and other N-channel MOS transistors (not shown) arranged adjacent to the transistor Tr4. The word line W2 is connected to the control gates of the N-channel MOS transistors Tr2 and Tr5 and other N-channel MOS transistors (not shown) arranged adjacent to the transistor Tr5. The word line W3 is connected to the control gates of the N-channel MOS transistors Tr3 and Tr6 and other N-channel MOS transistors (not shown) arranged adjacent to the transistor Tr6. Other word lines (not shown) are arranged horizontally and connected similarly.

The digit line D1 is connected to the drain regions of the transistors Tr1, Tr2 and Tr3 and other N-channel MOS transistors (not shown) arranged horizontally adjacent to the transistor Tr4. The digit line D2 is connected to the drain regions of the transistors Tr4, Tr5 and Tr6 and other N-channel MOS transistors (not shown) arranged horizontally adjacent to the transistor Tr6. Other digit lines (not shown) are arranged vertically and connected similarly.

The source line S1 is connected to the source region of the transistors Tr1 and Tr4 and other N-channel MOS transistors (not shown) arranged vertically adjacent to the transistor Tr4. The source line S2 is connected to the source regions of the transistors Tr2, Tr5 Tr3 and Tr6 and other N-channel MOS transistors (not shown) arranged vertically adjacent to the transistors Tr5 and Tr6. Other source lines (not shown) are arranged horizontally and connected similarly.

In the embodiment, each of the source lines are not connected to each other, so that an voltage applied to each of the source lines is given to only a part of the source regions, that is, those of the transistors of each row.

Preferably, the transistors of several bits or several tens bits are connected to each of the source lines.

The word lines W1, W2 . . . are connected to an X decoder, respectively, and one of the lines W1, W2 . . . is selected by address signals sent to the X decoder. The selected one can be supplied with a predetermined voltage. The digit lines D1, D2 . . . are connected to a Y decoder, respectively, and one of the lines D1, D2 . . . is selected by address signals sent to the Y decoder. The selected one can be supplied with a predetermined voltage.

Next, the reprogramming operation of the memory of the present invention will be described below.

In the memory of the present invention, predetermined data values are written to all the storage cells and then, the data values in the desired storage cells are erased separately.

The data writing operation is similar to that of the conventional one.

For example, the word line W1 is selected by the X decoder and supplied with a voltage of +10 V, and then the source line S1 is supplied with a voltage of +5 V. Thus, the control gates of the transistors including the transistors Tr1 and Tr4 which are connected to the source line S1 are supplied with the voltage of about +10 V and at the same time, the source regions thereof are supplied with the voltage of +5 V. The drain regions thereof are grounded through the drain lines.

As a result, with each of the transistors connected to the source line S1, a drain current flows along the channel and a high electric field is generated between the channel and the floating gate. Since the potential of the control gate is higher than that of the source region, the hot electrons in the channel are injected to the floating gate and stored therein. As a result, the reprogramming data values are stored in the storage cells connected to the source line S1.

Next, the word lines W2 and W3 are selected by the X decoder and supplied with a voltage of +10 V, and then the source line S2 is supplied with a voltage of +5 V. Thus, the reprogramming data values are stored in the storage cells connected to the source line S2 including the transistors Tr2, Tr3, Tr5 and Tr6 in the same way.

After that, the same process is repeated until all the word lines are selected. Thus, the reprogramming data values are written to all the storage cells of the memory.

Subsequently, a desired one of the storage cells in which the data values are written is selected and the data value thereof is erased. For example, in case that the data value of the storage cell of the transistor Tr2 is erased, the following process is performed.

First, all the source lines are floated, and the word line W2 to which the transistor Tr2 is connected is selected by the X decoder and then grounded. The remainder of the word lines are supplied with a voltage pulse ranging from +5 V to +6 V. Thus, the control gates of the transistors connected to the word line W2 are grounded, and the control gates of the remainder are supplied with the voltage pulse ranging from +5 V to +6 V.

Next, the digit line D1 to which the transistor Tr2 is connected is selected by the Y decoder and supplied with a voltage pulse ranging from +12 V to +13 V. The remainder of the digit lines are floated. Thus, the voltage pulse ranging from +12 V to +13 V is supplied to the drain regions of the transistors, in which the transistor Tr2 is included, connected to the digit line D1.

At this time, with the transistor Tr2 selected, since the potential of the drain region 5 is high, the Fowler-Nordheim current flows from the floating gate 1 to the drain region 5 through the tunnel oxide film 2; thus the electrons stored in the floating gate 1 are drawn out therefrom toward the drain region 5. As a result, the reprogramming data value is erased in the storage cell of the transistor Tr2.

With the remainder of the cells or transistors, since the voltage pulse ranging from +5 V to +6 V is supplied to the control gates and no voltage pulse is supplied between the source regions and the drain regions thereof, the reprogramming data values are not erased.

Subsequently, the data values in all the storage cells are read out by supplying a proper voltage between the source regions and the drain regions thereof without applying a voltage to the control gates. Then, the data erasing level, that is, the threshold voltage level of each transistor is judged based on the result of the read. If the data erase is not enough, that is, the threshold voltage of each transistor is not reduced enough, the above process is performed again. The process is repeated thereafter if necessary.

As described above, with the memory of the present invention, data values are written to the entire storage cells and then, the cell whose data value is to be erased is selected and the data value thereof is erased. Thus, the threshold voltage of the transistor can be controlled well per cell after the data value is erased, so that the threshold voltage dispersion can be reduced. As a result, the data value can be surely read out by applying a low supply voltage such as 1.5 V.

In addition, each storage cell of the memory of the invention is composed of one transistor and no wiring layer is required to be formed so as to connect the respective cells separately, so that the cell area does not increase compared to the conventional memory whose storage cell is composed of one transistor.

The absolute value of the threshold voltage of the respective transistors reprogrammed is preferably in the range from 0.5 V to 0.7 V.

In the embodiment, if a proper number of groups are formed by dividing the entire cells or bits of the memory, for example, each group is composed of several bits or several tens bits or several bytes, the data erasing operation can be performed for every group.

The reprogramming method of the invention can be applied to any memories other than the memory having the structure shown in FIG. 5 if the reprogramming can be performed in the same way as in the embodiment.

In the embodiment, the hot electrons are injected to the floating gate, however, the hot holes may be injected by using N-semiconductor substrate.

What is claimed is:

1. A reprogrammable nonvolatile semiconductor memory having storage cells each of which is formed of an MOS transistor and arranged in a matrix array on a semiconductor substrate of a first electroconductive type, each of said transistors comprising:
   a source region and a drain region formed in a surface area of said substrate, both of which are of a second electroconductive type inverse in polarity to said first electroconductive type;
   a floating gate formed through a first gate insulator film on the surface of said substrate between said source region and said drain region; and
   a control gate formed through a second gate insulator film on said floating gate; and
   said substrate including
   word lines respectively connected to said control gates of said transistors belonging to each row of said matrix;
   digit lines respectively connected to said drain regions of said transistors belonging to each column of said matrix;
   sources lines respectively connected to said source regions of one of a plurality of groups which are obtained by dividing said matrix array;
   a first decoder for selecting at least one of said word lines;
   a second decoder for selecting at least one of said digit lines; and
   means for controlling threshold voltages of each of said cells wherein cells that have been reprogrammed have substantially the same threshold voltage;
   thereby a reprogramming data value being written to said desired cell by applying a voltage through said corresponding source line.

2. The reprogrammable nonvolatile semiconductor memory according to claim 1, wherein
   the P-N junction between said drain region of said second electroconductive type and said substrate of said first electroconductive type is a graded-junction, and
   said source region of said second electroconductive type has a DSA structure composed of a first region of said first electroconductive type and a second region of said second electroconductive type.

3. The reprogrammable nonvolatile semiconductor memory according to claim 1, wherein the absolute value of the threshold voltage of said respective transistors reprogrammed is in the range from 0.5 V to 0.7 V.

4. The reprogrammable nonvolatile semiconductor memory according to claim 1, wherein each of said source lines is connected to said source regions of said transistors belonging to each row of said matrix.

5. The reprogrammable nonvolatile semiconductor memory according to claim 1, wherein said reprogramming operation is performed by the steps of:
   writing data values to said transistors of one of said groups which is obtained by dividing the entire transistors through at least one of said source lines;
   selecting one of said transistors whose data values are written using said first and second decoders; and
   erasing said data value written in said selected transistor.

6. A reprogrammable nonvolatile semiconductor memory, comprising:
   a semiconductor substrate of a first electroconductive type;
   a plurality of MOS transistors arranged in a matrix array on said semiconductor substrate, each of said transistors comprising:
   a source region and a drain region of a second electroconductive type inverse in polarity to said first electroconductive type and formed on a surface area of said substrate;
   a floating gate formed through a first gate insulator film on the surface of said substrate between said source region and said drain region; and
   a control gate formed through a second gate insulator film on said floating gate; and
   said substrate including:
   first means for applying a voltage signal to said control gates of transistors of each row of said matrix;
   second means for applying a voltage signal to said drain regions of transistors of each column of said matrix;
   third means for applying a voltage signal to a subset of said source regions of said transistors;
   fourth means for selectively applying voltage signals via said first, second, and third means to control threshold voltages of each of said cells wherein cells that have been reprogrammed have substantially the same threshold voltage.

7. A reprogrammable nonvolatile semiconductor memory, according to claim 6, wherein said first means includes a plurality of word lines connected to said control gates and a first decoder for selecting one of said word lines.

8. A reprogrammable nonvolatile semiconductor memory, according to claim 6, wherein said second means includes a plurality of digit lines connected to said drains and a decoder for selecting one of said digit lines.

9. A reprogrammable nonvolatile semiconductor memory, according to claim 7, wherein said second means includes a plurality of digit lines connected to said drains and a second decoder for selecting one of said digit lines.

10. A reprogrammable nonvolatile semiconductor memory, according to claim 6, wherein said third means includes a plurality of source lines connected to said sources.

11. A reprogrammable nonvolatile semiconductor memory, according to claim 9, wherein said third means includes a plurality of source lines connected to said sources.

12. A reprogrammable nonvolatile semiconductor memory, according to claim 6, wherein an absolute value of threshold voltages of reprogrammed transistors is in a range from 0.5 V to 0.7 V.

13. A reprogrammable nonvolatile semiconductor memory, according to claim 11, wherein an absolute value of threshold voltages of reprogrammed transistors is in a range from 0.5 V to 0.7 V.

14. A reprogrammable nonvolatile semiconductor memory, according to claim 6, wherein a P-N junction between said drain region and said substrate is a graded junction and said source region has a DSA structure.

15. A reprogrammable nonvolatile semiconductor memory, according to claim 13, wherein a P-N junction between said drain region and said substrate is a graded junction and said source region has a DSA structure.

* * * * *

UNITED STATES PATENT AND TRADEMARK OFFICE
CERTIFICATE OF CORRECTION

PATENT NO. : 5,398,202
DATED : March 14, 1995
INVENTOR(S) : Norio NAKAMURA It is certified that error appears in the above-identified patent and that said Letters Patent is hereby corrected as shown below:

At the title page, the following priority data should appear

--[30] Foreign Application Priority Data
    May 15, 1992  [JP]  Japan..............4-148580--

Signed and Sealed this

First Day of August, 1995

Attest:

BRUCE LEHMAN

Attesting Officer      Commissioner of Patents and Trademarks